US008008723B2

(12) United States Patent
Nagai (10) Patent No.: US 8,008,723 B2
(45) Date of Patent: Aug. 30, 2011

(54) SEMICONDUCTOR DEVICE INCLUDING A PLURALITY OF DIFFUSION LAYERS AND DIFFUSION RESISTANCE LAYER

(75) Inventor: Takayuki Nagai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 32 days.

(21) Appl. No.: 12/379,510

(22) Filed: Feb. 24, 2009

(65) Prior Publication Data

US 2009/0242991 A1 Oct. 1, 2009

(30) Foreign Application Priority Data

Mar. 27, 2008 (JP) .................................. 2008-083700

(51) Int. Cl.
*H01L 29/66* (2006.01)

(52) U.S. Cl. ........ 257/355; 257/356; 257/582; 257/538; 257/577; 257/579; 257/173; 257/E29.166; 257/E23.114; 257/E23.115

(58) Field of Classification Search .................. 257/355, 257/E29.166, E23.114, E23.115, 256, 582, 257/538, 578, 577, 579, 173
See application file for complete search history.

(56) References Cited

U.S. PATENT DOCUMENTS

| 4,757,363 A * | 7/1988 | Bohm et al. ................... 257/358 |
| 5,374,844 A * | 12/1994 | Moyer .......................... 257/582 |
| 5,936,282 A * | 8/1999 | Baba et al. ..................... 257/355 |
| 7,408,754 B1 * | 8/2008 | O et al. ......................... 361/91.1 |
| 2004/0075529 A1 * | 4/2004 | Lakshmikumar ............. 338/308 |
| 2004/0173867 A1 * | 9/2004 | Beigel ........................... 257/500 |
| 2006/0258067 A1 * | 11/2006 | Jeon et al. ...................... 438/154 |
| 2007/0020818 A1 * | 1/2007 | Yu et al. ......................... 438/128 |
| 2008/0029782 A1 * | 2/2008 | Carpenter et al. ............. 257/173 |

FOREIGN PATENT DOCUMENTS

| JP | 2-70229 | 3/1990 |
| JP | 6-302765 | 10/1994 |
| JP | 10-150109 | 6/1998 |
| JP | 2005-109163 | 4/2005 |

\* cited by examiner

*Primary Examiner* — Wai-Sing Louie
*Assistant Examiner* — Marc Armand
(74) *Attorney, Agent, or Firm* — McGinn IP Law Group, PLLC (57) ABSTRACT

Aimed at reducing the area of a protective circuit in a semiconductor device provided therewith, a semiconductor device of the present invention has a first-conductivity-type well, a plurality of first diffusion layers formed in the well, a plurality of second diffusion layers formed in the well, and a diffusion resistance layer formed in the well, wherein the first diffusion layers have a second conductivity type, and are connected in parallel with each other to an input/output terminal of the semiconductor device; the second diffusion layers are arranged alternately with a plurality of first diffusion layers, and are connected to a power source or to the ground; the diffusion resistance layer has a second conductivity type, and is located in adjacent to any of the plurality of second diffusion layers; the diffusion resistance layer is connected to the input/output terminal of the semiconductor device, while being arranged in parallel with the first diffusion layers, and connects the internal circuit and the input/output terminal of the semiconductor device.

19 Claims, 9 Drawing Sheets

SEMICONDUCTOR DEVICE INCLUDING A PLURALITY OF DIFFUSION LAYERS AND DIFFUSION RESISTANCE LAYER

This application is based on Japanese patent application No. 2008-083700 the content of which is incorporated hereinto by reference.

BACKGROUND

1. Technical Field

The present invention relates to semiconductor a device having a protective element.

2. Related Art

For the case where a protective element for protecting an internal circuit from static electricity or the like is provided to a semiconductor device, it is most general to arrange a resistive element for limiting current between the protective element and the internal circuit, to thereby prevent over-current from flowing into the internal circuit. The resistive element is typically a polysilicon resistor composed of polysilicon, or a diffusion layer resistor composed of a diffusion layer. In some cases where the diffusion layer resistor is used, it may be integrated with the protective element so as to reduce the occupied area (see Japanese Laid-Open Patent Publication Nos. 02-070229 and 06-302765, for example).

Alternatively, as shown in Japanese Laid-Open Patent Publication Nos. 10-150109 and 2005-109163, there are proposed a bipolar transistor protective element and a diode protective element, both having a large number of dot-patterned diffusion layers arranged to form an array. These dot-patterned protective elements may be increased in the length of opposition between the emitter and collector, or between the cathode and anode, and may consequently have larger protection tolerance, as compared with those of the bipolar transistor protective element and diode protective element, which make use of a diffusion layer having a large area.

However, the diffusion layers of the dot-patterned protective elements are extremely small, so that it may be difficult to use the diffusion layers as the diffusion layer resistor. For this reason, the semiconductor device has been configured to have an additional resistor typically using polysilicon, provided to the external of the dot-patterned protective element, only to enlarge the semiconductor device.

SUMMARY

According to the present invention, there is provided a semiconductor device which includes:

a first-conductivity-type well;

a plurality of first diffusion layers formed in the well, having a second conductivity type, and connected in parallel with each other to a signal input/output terminal;

a plurality of second diffusion layers formed in the well, arranged alternatively with the plurality of first diffusion layers, and connected to a power source or to the ground; and a diffusion resistance layer formed in the well, having a second conductivity type, located in adjacent to any of the plurality of second diffusion layers, connected to the input/output terminal while being arranged in parallel with the first diffusion layers, and connecting an internal circuit and the input/output terminal.

According to the present invention, even if the total area of the first diffusion layers and the second diffusion layers becomes smaller due to provision of the diffusion resistance layer, the diffusion resistance layer can act similarly to the first diffusion layers, so that the protective element may be suppressed from being lowered in the protection tolerance. The area of the protective circuit (containing the protective element and resistors) may be reduced as compared with a configuration having an external resistor provided thereto, while assuming the protection tolerance of the both as identical. As a consequence, the semiconductor device may be suppressed from being enlarged.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that, in all drawings, any similar constituents will be given with similar reference numerals or symbols, so that explanations of which will not be repeated.

Figure 1:
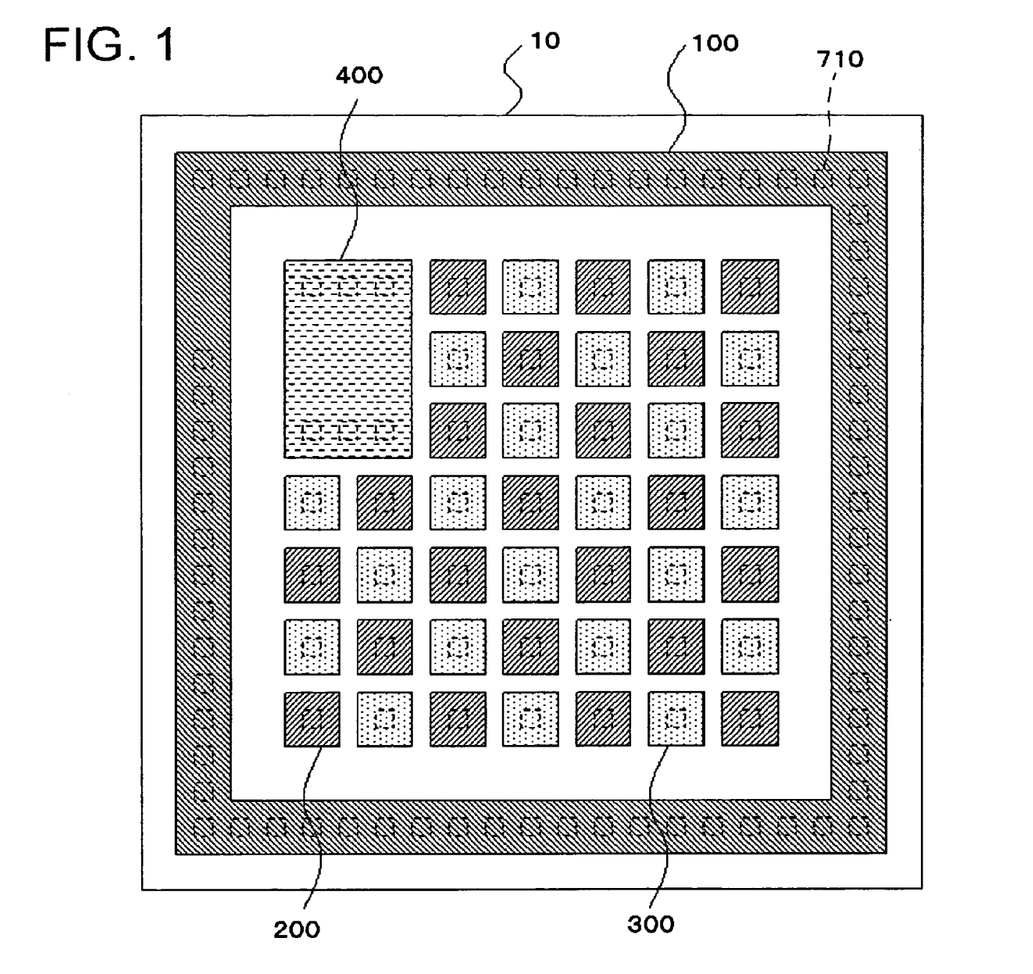
FIG. 1 is a plan view explaining a configuration of a semiconductor device of a first embodiment.

FIG. 1 is a plan view explaining a configuration of a semiconductor device of the first embodiment. The semiconductor device has a protective element. The protective element has a first-conductivity-type well 10, a plurality of first diffusion layers 200 formed in the well 10, a plurality of second diffusion layers 300 formed in the well 10, and a diffusion resistance layer 400 formed in the well 10. The first diffusion layers 200 have a second conductivity type, and are connected in parallel with each other to an input/output terminal of the semiconductor device. The second diffusion layers 300 are arranged alternately with the plurality of first diffusion layers 200, and are connected to a power source or to the ground. The diffusion resistance layer 400 has a second conductivity type, and is located in adjacent to any of the plurality of second diffusion layers 300. The diffusion resistance layer 400 is connected to the input/output terminal of the semiconductor device, while being arranged in parallel with the first diffusion layers 200, and connects the internal circuit and the input/output terminal of the semiconductor device.

If surge current, such as ascribable to static electricity, enters the input/output terminal, the surge current is allowed to discharge from the first diffusion layers 200, through the well 10 and the second diffusion layers 300, to a power source or to the ground. The diffusion resistance layer 400 prevents the surge current to flow into the internal circuit. Since the diffusion resistance layer 400 is formed in the same well 10 in which the first diffusion layers 200 and the second diffusion layers are formed, and has the same conductivity type with the first diffusion layers 200, so that part of the surge current may be discharged from the diffusion resistance layer 400 through the well 10 and the second diffusion layers 300 to the power source of to the ground. By virtue of this configuration, even if the total area of the first diffusion layers 200 and the second diffusion layers 300 becomes smaller due to provision of the diffusion resistance layer 400, the protective element may be suppressed from being consequently lowered in the protection tolerance. Accordingly, the occupied area of the protective circuit (containing the protective element and resistors) may be reduced as compared with a configuration having an external resistor provided thereto, while assuming the protection tolerance of the both as identical. As a consequence, the semiconductor device may be suppressed from being enlarged. Details will be given below.

When the semiconductor device is viewed from the top, the well 10 in this embodiment has a square (or rectangular) form. The first diffusion layers 200 and the second diffusion layers 300 have a nearly equivalent geometry, and are arranged at regular intervals to form a matrix, in the square (or rectangular) region of the well 10. The diffusion resistance layer 400 is arranged at one of four corners of the square region.

The diffusion resistance layer 400 has a rectangular geometry, having two edges thereof opposed with the first diffusion layers 200 and second diffusion layers 300. More specifically, the diffusion resistance layer 400 is located in the vicinity of the edges which specify the outer circumference of the well 10, and there are no first diffusion layers 200 and no second diffusion layers 300 located between these edges and the diffusion resistance layer 400. The distance between the diffusion resistance layer 400 and each of all second diffusion layers 300 located in adjacent to the diffusion resistance layer 400 is equal to the distance between each of the first diffusion layers 200 and the second diffusion layers 300 adjacent to each other.

Each of the first diffusion layers 200 and the second diffusion layers 300 has a square form having an edge of 0.5 to 5 μm long, and is distant 0.1 to 1 μm away from each other. The area of the diffusion resistance layer 400 is larger than the total area of one first diffusion layer 200 and one second diffusion layer 300, and is typically 2 to 20 times as large as one first diffusion layers 200. For this reason, the length of opposition, which is expressed by the sum of the length of the portion where the first diffusion layers 200 and the second diffusion layers 300 are opposed with each other and the length of the portion where the first diffusion layers 200 and the diffusion resistance layer 400 are opposed with each other, may be reduced as compared with a configuration having the first diffusion layers 200 and the second diffusion layers 300 provided in place of the diffusion resistance layer 400. However, as described in the above, since the diffusion resistance layer 400 is located in the vicinity of the edges which specify the outer circumference of the well 10, and since there are no first diffusion layer 200 and the second diffusion layer 300 located between the diffusion resistance layer 400 and the edges closest to the diffusion resistance layer 400. As a consequence, reduction in the length of opposition may be suppressed as compared with a configuration having the diffusion resistance layer 400 arranged deep inside the square region so as to make all of four edges thereof opposed with the first diffusion layers 200 and the second diffusion layers 300.

The square region, having the first diffusion layers 200, the second diffusion layers 300, and the diffusion resistance layer 400 arranged therein, is surrounded by a first-conductivity-type diffusion layer 100. The diffusion layer 100 is formed to draw a square pattern, and is provided in order to control potential of the well 10. Among the edges which specify the inner circumference of the diffusion layer 100, the edge closest to the diffusion resistance layer 400 is away from the diffusion resistance layer 400 typically by a distance not larger than the width of the first diffusion layers 200.

Figure 2:
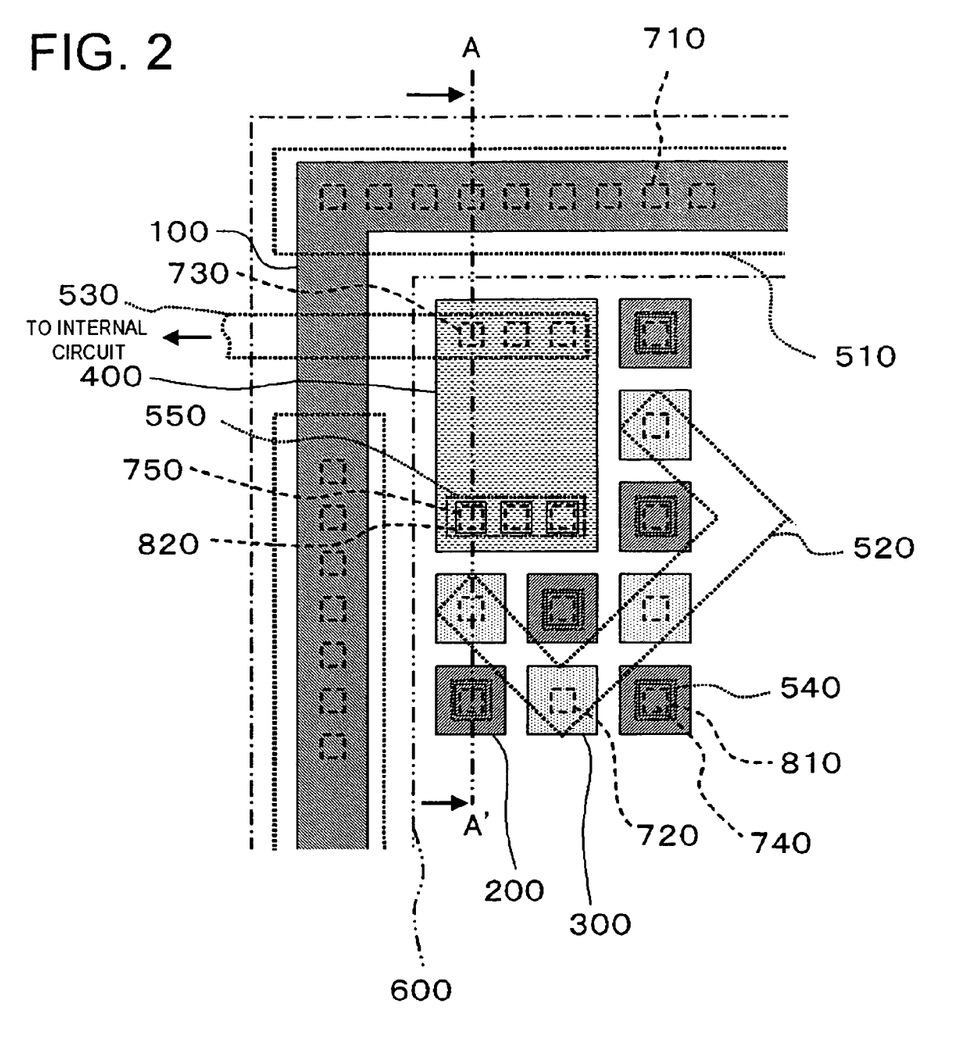
FIG. 2 is an enlarged view of a part of FIG. 1.
Figure 3:
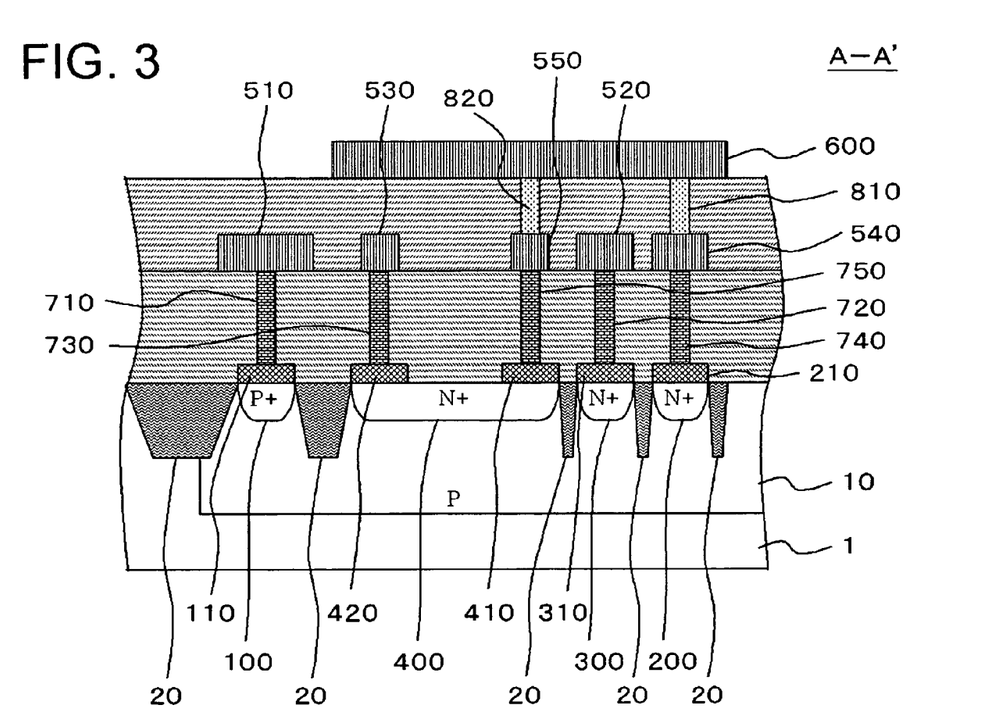
FIG. 3 is a sectional view taken along line A-A' in FIG. 2.
Figure 4:
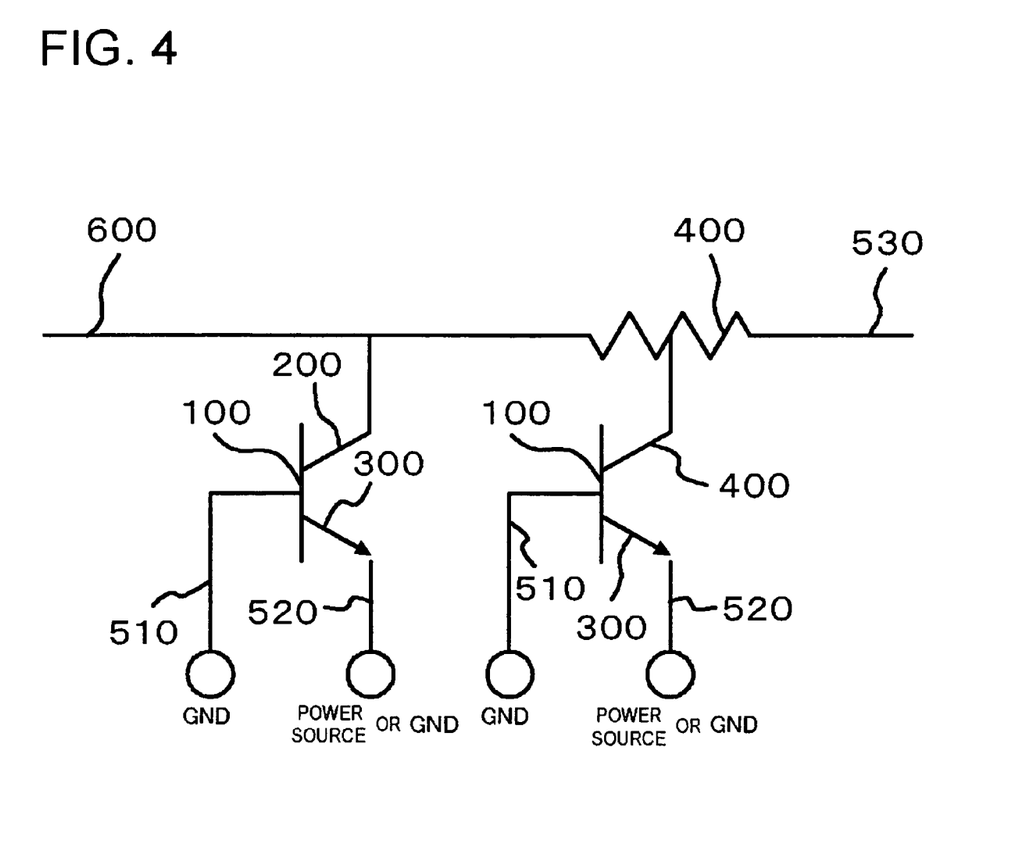
FIG. 4 is an equivalent circuit diagram of the semiconductor device illustrated in FIG. 1 to FIG. 3.

FIG. 2 is an enlarged view of a part of FIG. 1, and FIG. 3 is a sectional view taken along line A-A' in FIG. 2. FIG. 4 is an equivalent circuit diagram of the semiconductor device illustrated in FIG. 1 to FIG. 3. The diffusion layer 100, the first diffusion layers 200, the second diffusion layers 300, and the diffusion resistance layer 400 are isolated from each other by a device isolation film 20. The device isolation film 20 is buried in a semiconductor layer 1. The semiconductor layer 1 may be a semiconductor substrate such as a silicon substrate, or may be a semiconductor layer of an SOI substrate.

The diffusion layer 100 is connected through silicide layers 110 and contacts 710 to an interconnect 510 of a first interconnect layer. The interconnect 510 is connected to the ground. When viewed from the top of the semiconductor device, the interconnect 510 is formed along the diffusion layer 100, but is discontinued in the vicinity of the region over the diffusion resistance layer 400. Through the discontinued portion, an interconnect 530 of the first interconnect layer, for connecting the protective element with the internal circuit, is extended.

The first diffusion layers 200 are connected through silicide layers 210, contacts 740, electro-conductive patterns 540 of the first interconnect layer, and vias 810 to an interconnect 600 of a second interconnect. The interconnect 600 is connected to the input/output terminal, and covers, when viewed from the top of the semiconductor device, the square region having the first diffusion layers 200, the second diffusion layers 300, and the diffusion resistance layer 400 arranged therein.

The second diffusion layers 300 are connected through silicide layers 310 and contacts 720 to an interconnect 520 of the first interconnect. The interconnect 520 is connected to the ground or the power source.

The diffusion resistance layer 400 is connected, in the vicinity of one shorter edge thereof, through silicide layers 410, contacts 750, electro-conductive patterns 550 of the first interconnect layer, and vias 820 to the interconnect 600. The diffusion resistance layer 400 is connected, in the vicinity of the other shorter edge thereof, through silicide layers 420 and contacts 730 to the interconnect 530 of the first interconnect. The silicide layers 410, 420 located below the contacts 750, 730 are not connected with each other. Therefore, the diffusion resistance layer 400 may be suppressed from being lowered in the resistivity, so that the area of the diffusion resistance layer 400 may consequently be reduced. The resistivity of the diffusion resistance layer 400 may be adjustable by adjusting the size of the silicide layers 410, 420, and thereby characteristics of the protective circuit may be adjustable.

As illustrated in FIG. 3, the first conductivity type in this embodiment is P-type, and the second conductivity type is N-type. The second diffusion layers 300 have the second conductivity type, or N-type. In this case, as illustrated by the equivalent circuit diagram in FIG. 4, the diffusion layer 100, the well 10, the first diffusion layers 200, and the second diffusion layers 300 compose a bipolar element as the protective element. On the other hand, also the diffusion layer 100, the well 10, the diffusion resistance layer 400, and the second diffusion layer 300 compose a bipolar element as the protective element. The diffusion layer 100 functions as the base, the first diffusion layers 200 and the diffusion resistance layer 400 function as the emitter, and the second diffusion layer 300 functions as the collector.

Figure 5A:
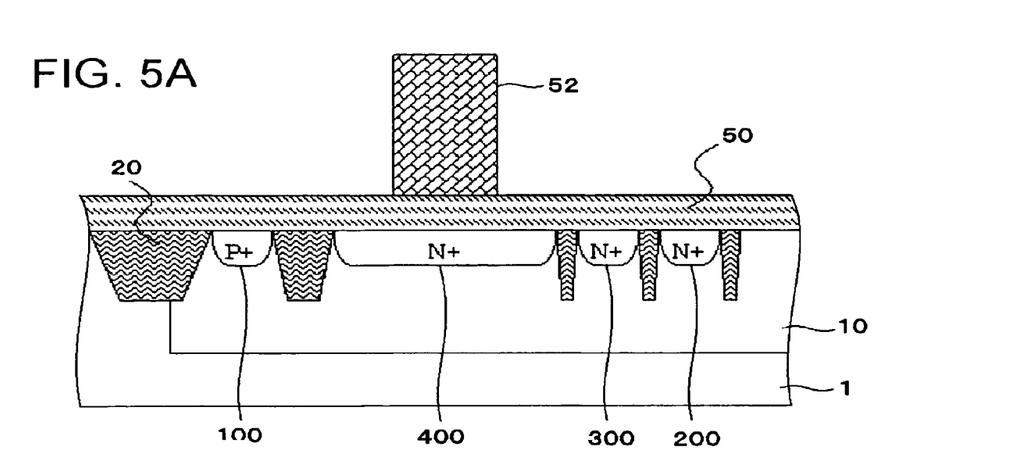
FIGS. 5A to 5C are sectional views illustrating a method of manufacturing the semiconductor device illustrated in FIG. 1 to FIG. 3.
Figure 5B:
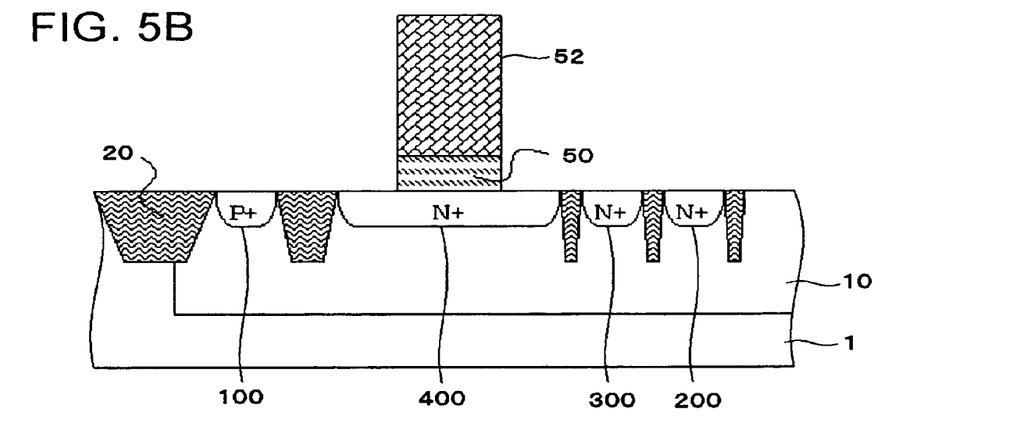
Figure 5C:
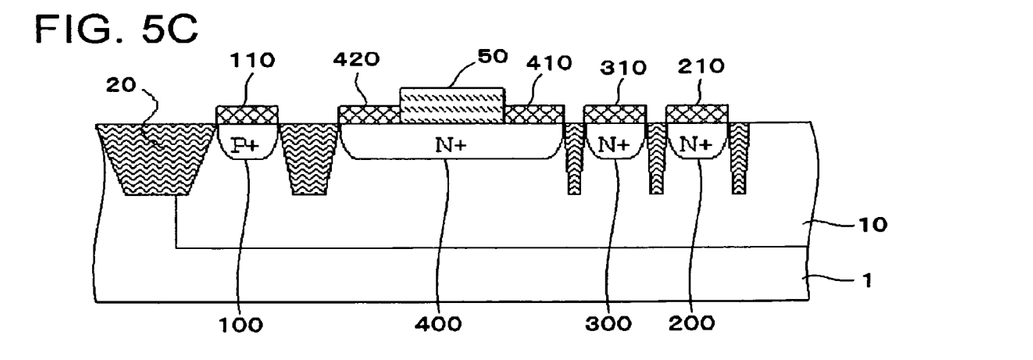

FIGS. 5A to 5C are sectional views illustrating a method of manufacturing the semiconductor device illustrated in FIG. 1 to FIG. 3. First, as shown in FIG. 5A, the device isolation film 20 having the STI structure is formed in the semiconductor layer 1. The depth of the device isolation film 20 is typically 0.1 μm to 5 μm. Next, the well 10 is formed by ion implantation using a resist mask. Next, a gate oxide film, gate electrodes, LDD regions, and side walls (all of which not illustrated) of CMOS transistors composing the internal circuit are formed. Next, the diffusion layer 100, the first diffusion layers 200, the second diffusion layers 300, and the diffusion resistance layer 400 are formed by ion implantation using resist masks. In this process, also the sources and drains of the CMOS transistors are formed.

Next, a silicon oxide film 50 is formed over the device isolation film 20, the diffusion layer 100, the first diffusion layers 200, the second diffusion layers 300, and the diffusion resistance layer 400. Next, a resist pattern 52 is formed on the silicon oxide film 50. The resist pattern 52 covers a region of the diffusion resistance layer 400 where the silicide layers will not be formed therein later.

Next, as illustrated in FIG. 5B, the silicon oxide film 50 is etched using the resist pattern 52 as a mask. By this process, the silicon oxide film 50 is removed, except for the region thereof where the silicide layers will not be formed therein later.

Next, as shown in FIG. 5C, the resist pattern 52 is removed. Next, a metal film such as Ti film, Co film or the like, is formed over the diffusion layer 100, the first diffusion layers 200, the second diffusion layers 300, the diffusion resistance layer 400, and silicon oxide film 50, and then annealed. By these processes, the silicide layers 110, 210, 310, 410 and 420 are formed. The residual metal film is then removed.

Thereafter, the insulating interlayer as the first layer, the contacts 710 to 750, the first interconnect layer, the insulating interlayer as the second layer, the vias 810, 820, and the second interconnect layer are formed.

As has been described in the above, according to this embodiment, the diffusion resistance layer 400 is formed in the same well 10 in which the first diffusion layers 200 and the second diffusion layers 300 are formed, and has the same conductivity type with the first diffusion layers 200, so that a part of surge current flown from the input/output terminal may be discharged from the diffusion resistance layer 400, through the well 10 and the second diffusion layers 300, to the power source or the ground. Accordingly, even if the area of the region, having the first diffusion layers 200 and the second diffusion layers 300 formed therein, becomes smaller due to provision of the diffusion resistance layer 400 in the well 10, the protective element may be suppressed from being consequently lowered in the protection tolerance. As a consequence, the occupied area of the protective circuit may be reduced as compared with a configuration having an external resistor provided thereto, while assuming the protection tolerance of the both as identical. The semiconductor device may therefore be suppressed from being enlarged. This effect may be particularly distinctive, when the distance between the diffusion resistance layer and the second diffusion layers 300 is nearly equal to the distance between the first diffusion layers 200 and the second diffusion layers 300.

The diffusion resistance layer 400 is arranged at the corner of the square region having the first diffusion layers 200 and the second diffusion layers 300 arranged therein, and two edges thereof oppose to the first diffusion layers 200 and the second diffusion layers 300. Accordingly, reduction in the length of opposition may be suppressed as compared with a configuration having the diffusion resistance layer 400 arranged deep inside the square region so as to make all of four edges thereof opposed to the first diffusion layers 200 and the second diffusion layers 300.

The silicide layers 410, 420 over the diffusion resistance layer 400 are not connected with each other. Accordingly, the diffusion resistance layer 400 may be suppressed from being lowered in resistivity, and the area of the diffusion resistance layer 400 may therefore be reduced. In addition, the resistivity of the diffusion resistance layer 400 may be adjustable by adjusting the size of the silicide layers 410, 420, and thereby characteristics of the protective circuit may be adjustable.

Figure 6:
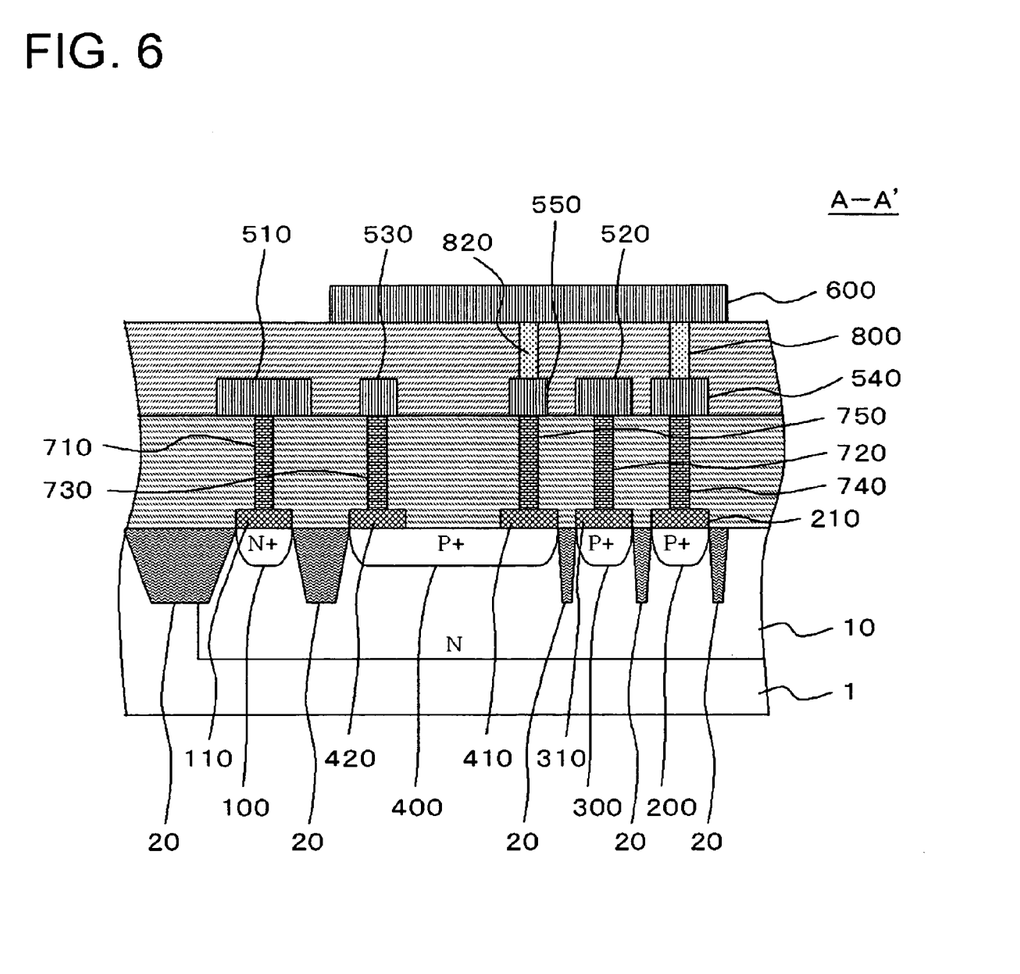
FIG. 6 is a sectional view explaining a configuration of a semiconductor device of a second embodiment.

FIG. 6 is a sectional view explaining a configuration of a semiconductor device of a second embodiment, and corresponds to FIG. 3 in the first embodiment. The semiconductor device is similar to that of the first embodiment, except that the well 10 and the diffusion layer 100 are N-type, and the first diffusion layers 200, the second diffusion layers 300, and the diffusion resistance layer 400 are P-type. In the description below, any constituents similar to those in the first embodiment will be given with the same reference numerals, and explanations of which will not be repeated.

A method of manufacturing the semiconductor device of this embodiment is similar to as described in the first embodiment. Effects similar to those in the first embodiment may be obtainable also in this embodiment.

Figure 7:
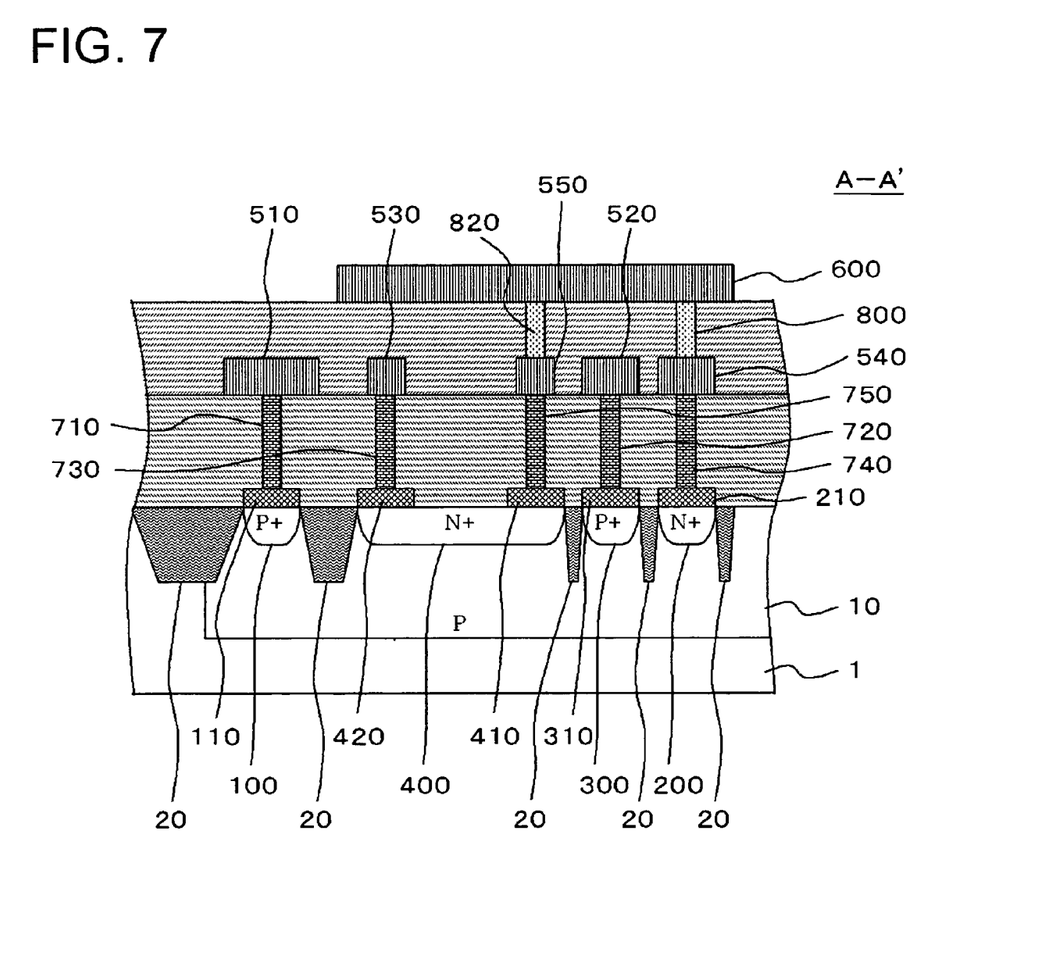
FIG. 7 is a sectional view explaining a configuration of a semiconductor device of a third embodiment.

FIG. 7 is a sectional view explaining a configuration of a semiconductor device of a third embodiment, and corresponds to FIG. 3 in the first embodiment. This embodiment is similar to the first embodiment, except that the second diffusion layer 300 has the first conductivity type, similarly to the well 10 and the diffusion layer 100. In this embodiment, the first conductivity type is P-type, and the second conductivity type is N-type. In the description below, any constituents similar to those in the first embodiment will be given with the same reference numerals, and explanations of which will not be repeated.

Figure 8:
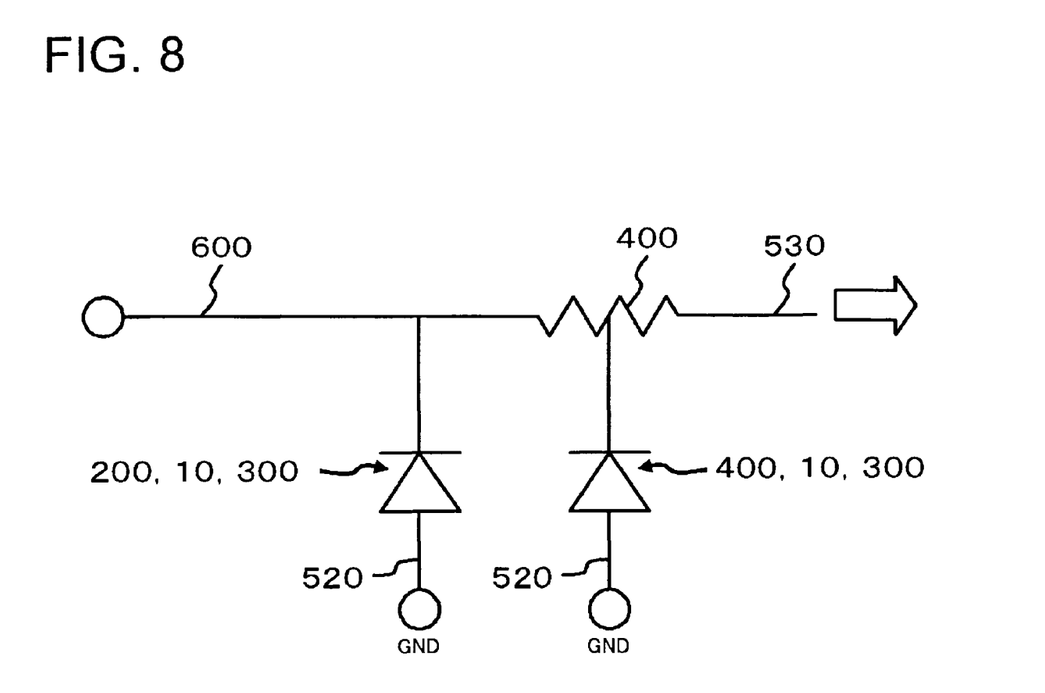
FIG. 8 is an equivalent circuit diagram of a protective circuit owned by the semiconductor device illustrated in FIG. 7.

FIG. 8 is an equivalent circuit diagram of a protective circuit owned by the semiconductor device illustrated in FIG. 7. As illustrated in the drawing, the first diffusion layers 200, the well 10, and the second diffusion layers 300 compose a diode as the protective element. On the other hand, also the diffusion resistance layer 400, the well 10, and the second diffusion layers 300 compose a diode as the protective element. The first diffusion layers 200 and the diffusion resistance layer 400 function as the cathode, and the diffusion layer 100 and the second diffusion layers 300 function as the anode.

A method of manufacturing the semiconductor device of this embodiment is similar to as described in the first embodiment. Effects similar to those in the first embodiment may be obtainable also in this embodiment.

Figure 9:
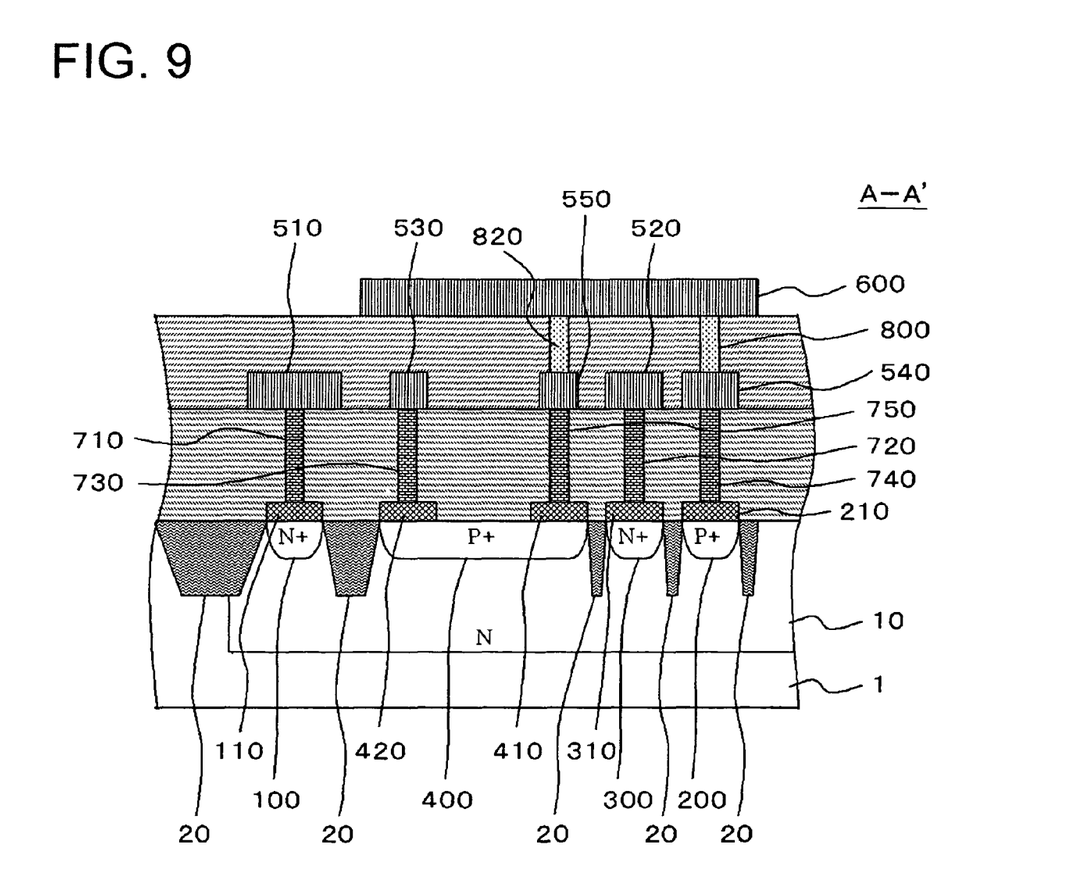
FIG. 9 is a sectional view explaining a configuration of a semiconductor device of a fourth embodiment.

FIG. 9 is a sectional view explaining a configuration of a semiconductor device of a fourth embodiment. The semiconductor device of this embodiment is similar to that of the third embodiment, except that the well 10, the diffusion layer 100, and the second diffusion layers 300 are N-type, and the first diffusion layers 200 and the diffusion resistance layer 400 are P-type. In this embodiment, the first diffusion layers 200 and the diffusion resistance layer 400 function as the anode, and the diffusion layer 100 and the second diffusion layers 300 function as the cathode.

A method of manufacturing the semiconductor device of this embodiment is similar to as described in the first embodiment. Effects similar to those in the first embodiment may be obtainable also in this embodiment.

The embodiments of the present invention have been described referring to the drawings, merely as examples of the present invention, while allowing adoption of any configurations other than those described in the above.

It is apparent that the present invention is not limited to the above embodiment, that may be modified and changed without departing from the scope and spirit of the invention.

What is claimed is:

1. A semiconductor device, comprising:
 a first-conductivity-type well;
 a plurality of first diffusion layers formed in said well, having a second conductivity type, and connected to a signal input/output terminal;
 a plurality of second diffusion layers formed in said well, arranged alternately with said plurality of first diffusion layers, and connected to a power source or to ground; and
 a diffusion resistance layer formed in said well, having a second conductivity type, located adjacent to said plurality of second diffusion layers, connected to said input/output terminal, and connecting an internal circuit and said input/output terminal,
 wherein in a plan view, in each row and each column of a matrix of said plurality of second diffusion layers and said plurality of first diffusion layers, said plurality of second diffusion layers are placed alternately with respect to said plurality of first diffusion layers.

2. The semiconductor device as claimed in claim 1, wherein said plurality of first diffusion layers and said plurality of second diffusion layer are alternately arranged while keeping regular intervals in between, and
 wherein a distance between said diffusion resistance layer and said second diffusion layers is nearly equal to a distance between said first diffusion layers and said second diffusion layers.

3. The semiconductor device as claimed in claim 1, wherein said plurality of second diffusion layers has a second conductivity type.

4. The semiconductor device as claimed in claim 1, wherein said plurality of second diffusion layers has a first conductivity type.

5. The semiconductor device as claimed in claim 1, further comprising:
 a first contact allowing therethrough connection between an interconnect connected to said input/output terminal and said diffusion resistance layer;
 a second contact allowing therethrough connection between an interconnect connected to said internal circuit and said diffusion resistance layer; and
 silicide layers formed on a surface of said diffusion resistance layer, located respectively below said first contact and said second contact, while being isolated from each other.

6. The semiconductor device as claimed in claim 1, wherein said diffusion resistance layer has an area larger than the total area of one of said first diffusion layers and one of said second diffusion layers, and
 wherein said first diffusion layers and said second diffusion layers are not located in an area between one edge specifying an outer circumference of said well, which has a shortest distance to said diffusion resistance layer, and said diffusion resistance layer.

7. The semiconductor device as claimed in claim 1, wherein said diffusion resistance layer is located adjacent to said plurality of first diffusion layers.

8. The semiconductor device as claimed in claim 1, wherein each of said plurality of second diffusion layers is spaced apart from an adjacent second diffusion layer by one of said plurality of first diffusion layers.

9. The semiconductor device as claimed in claim 1, wherein each of said plurality of second diffusion layers is placed adjacent to at least two adjacent first diffusion layers of said plurality of first diffusion layers.

10. The semiconductor device as claimed in claim 1, wherein one of said plurality of second diffusion layers is placed adjacent to four adjacent first diffusion layers of said plurality of first diffusion layers.

11. The semiconductor device as claimed in claim 1, wherein a conductivity type of said diffusion resistance layer is a same as a conductivity type of said plurality of first diffusion layers.

12. The semiconductor device as claimed in claim 1, wherein two edges of said diffusion resistance layer are exposed to said plurality of first diffusion layers and said plurality of second diffusion layers.

13. The semiconductor device as claimed in claim 1, wherein said first diffusion layers and said second diffusion layers are located in other than an area between one edge defining an outer circumference of said well, which has a shortest distance to said diffusion resistance layer, and said diffusion resistance layer.

14. The semiconductor device as claimed in claim 1, further comprising:
 a device isolation film extending from at least one edge of said diffusion resistance layer to an edge defining an outer circumference of said well.

15. The semiconductor device as claimed in claim 1, wherein said diffusion resistance layer spaces apart said plurality of first diffusion layers and said plurality of second diffusion layers from an edge specifying an outer circumference of said well.

16. The semiconductor device as claimed in claim 1, further comprising:
 a first-conductivity-type diffusion layer encircling said first diffusion layers, said second diffusion layers, and said diffusion resistance layer.

17. A semiconductor device, comprising:
 a first-conductivity-type well;
 a plurality of first diffusion layers formed in said well and being connected to a signal input/output terminal;
 a plurality of second diffusion layers formed in said well, arranged alternately between said plurality of first diffusion layers, and connected to a power source or to ground; and
 a diffusion resistance layer formed in said well, located adjacent to said plurality of first diffusion layers and said plurality of second diffusion layers, connected to said input/output terminal, to connect an internal circuit of said semiconductor device to said input/output terminal,
 wherein in a plan view, in each row and each column of a matrix of said plurality of second diffusion layers and said plurality of first diffusion layers, said plurality of second diffusion layers are placed alternately with respect to said plurality of first diffusion layers.

18. The semiconductor device as claimed in claim 17, further comprising:
 a first-conductivity-type diffusion layer encircling said first diffusion layers, said second diffusion layers, and said diffusion resistance layer.

19. The semiconductor device as claimed in claim 17, wherein a conductivity type of said diffusion resistance layer is a same as a conductivity type of said plurality of first diffusion layers.

* * * * *